(12) United States Patent
Yamamoto et al.

(10) Patent No.: US 7,372,149 B2
(45) Date of Patent: May 13, 2008

(54) HIGH FREQUENCY SEMICONDUCTOR APPARATUS, TRANSMITTING APPARATUS AND RECEIVING APPARATUS

(75) Inventors: Makoto Yamamoto, Tenri (JP); Eiji Suematsu, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 174 days.

(21) Appl. No.: 11/115,213

(22) Filed: Apr. 27, 2005

(65) Prior Publication Data
US 2006/0017157 A1 Jan. 26, 2006

(30) Foreign Application Priority Data
Apr. 30, 2004 (JP) ............................ P2004-136402
Apr. 25, 2005 (JP) ............................ P2005-126932

(51) Int. Cl.
*H01L 23/34* (2006.01)
(52) U.S. Cl. .............................. 257/728; 257/E21.001; 29/25.01
(58) Field of Classification Search .............. 257/728, 257/E21.001; 29/25.01
See application file for complete search history.

(56) References Cited

U.S. PATENT DOCUMENTS

| | | | |
|---|---|---|---|
| 6,400,576 B1 * | 6/2002 | Davidson | 361/763 |
| 6,566,601 B2 * | 5/2003 | Maetani | 174/535 |
| 6,712,284 B2 * | 3/2004 | Aoki et al. | 257/183 |
| 7,057,279 B2 * | 6/2006 | Ogawa | 257/728 |
| 2003/0042603 A1 * | 3/2003 | Koh | 257/728 |
| 2003/0071350 A1 * | 4/2003 | Takehara et al. | 257/728 |
| 2003/0160322 A1 * | 8/2003 | Hsieh et al. | 257/728 |
| 2004/0077124 A1 * | 4/2004 | Ogawa | 438/106 |

FOREIGN PATENT DOCUMENTS

JP  8-250913 A  9/1996

* cited by examiner

*Primary Examiner*—Michelle Estrada
(74) *Attorney, Agent, or Firm*—Birch, Stewart, Kolasch & Birch, LLP

(57) ABSTRACT

A high frequency semiconductor apparatus is provided which prevents characteristics of a high frequency semiconductor element from being deteriorated so that the high frequency semiconductor element can be made to operate stably. The high frequency semiconductor apparatus is so configured that heat generated by a high frequency semiconductor element is sequentially conducted through a grounding via hole to a first ground layer, a first via hole, a first ground sublayer, a bonding material layer, a second ground layer, a second via hole, and a third ground layer.

9 Claims, 9 Drawing Sheets

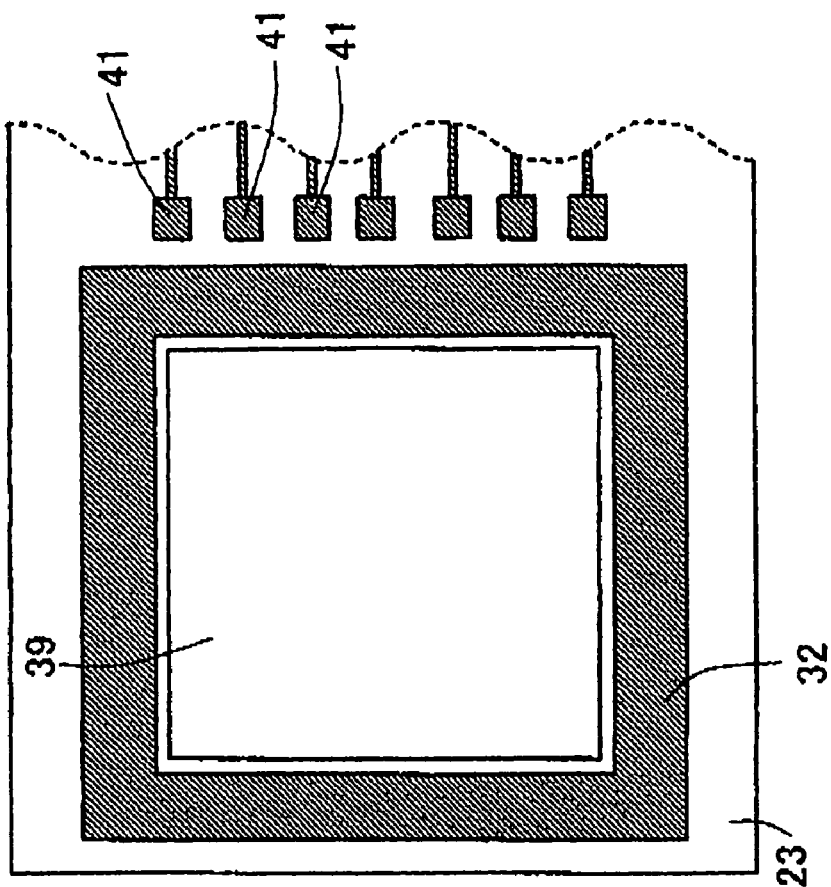
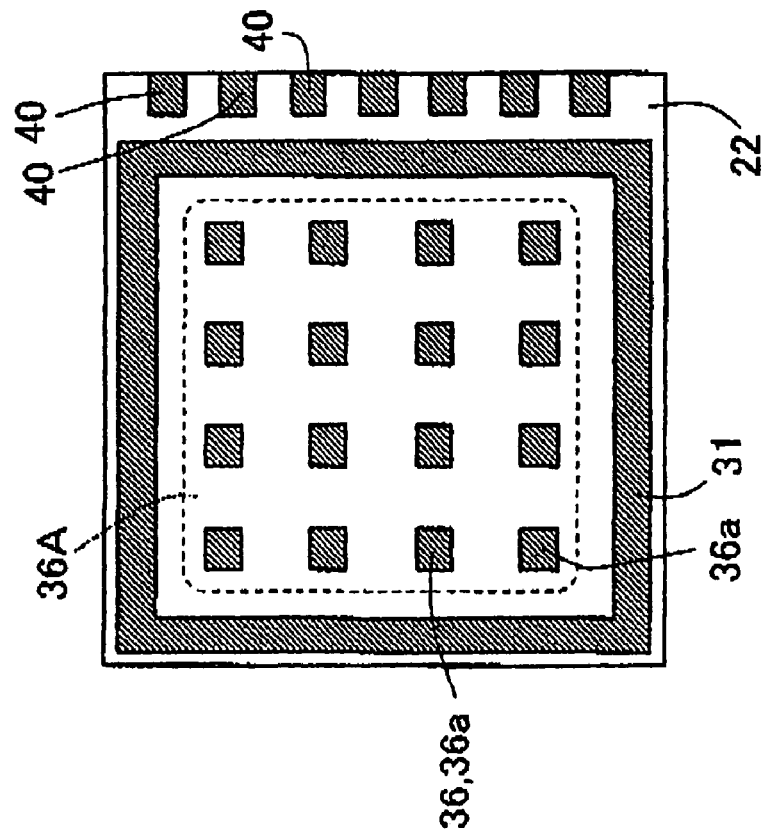

HIGH FREQUENCY SEMICONDUCTOR APPARATUS, TRANSMITTING APPARATUS AND RECEIVING APPARATUS

BACKGROUND OF THE INVENTION

1. Field of the Invention

The present invention relates to a high frequency semiconductor apparatus, transmitting apparatus and receiving apparatus, and an art applied to, for instance, an antenna-integrated wireless communication apparatus for microwave communication having an antenna function.

2. Description of the Related Art

In recent years, as the processing speed of a data processing apparatus and the resolution of an image processing apparatus have increased, a high-speed and large-capacity personal communication using a high frequency wave such as a microwave has attracted public attention. Since there is higher power loss at a connecting portion of an antenna and a high frequency circuit especially in a millimeter-wave band, it has been attempted to develop an antenna-integrated wireless communication apparatus having the antenna and the high frequency circuit integrated (for instance, refer to Japanese Unexamined Patent Publication JP-A 8-250913 (1996) (page 5, FIG. 10)).

FIG. 9 is a cross sectional view showing a conventional high frequency semiconductor apparatus. The antenna-integrated wireless communication apparatus comprises a base 4 having dielectric layers 1 and 2 and a ground layer 3 which is sandwiched between the dielectric layers 1 and 2. The ground layer 3 is provided with a slot portion 4a. A planar antenna 6 is formed on one surface of a package 5 facing outside. A feeding microstrip line 7 is formed on one surface of the dielectric layer 1 facing an internal space of the package. The feeding microstrip lines 7 are electrically connected to an output terminal 9 and input terminal 10 of a monolithic microwave integrated circuit 8 (abbreviated to MMIC) with a bonding wire 11.

A conventional high frequency transmission line as typified by a microstrip has a width of only several hundred of micrometers (μm) since characteristic impedance of the conventional high frequency transmission line is 50 Ω. In the above-described antenna-integrated wireless communication apparatus, heat generated by the MMIC must be radiated by the feeding microstrip line 7 which is narrow in width and connected to the MMIC. Therefore, it is not possible to sufficiently radiate the heat generated by a high frequency semiconductor element such as the MMIC, and the heat is confined to a space closed by a lid 12. As a result, the high frequency semiconductor element operates in a high temperature caused by the heat generated by the high frequency semiconductor element itself, which leads a bungle or deterioration of characteristics.

SUMMARY OF THE INVENTION

An object of the invention is to provide a high frequency semiconductor apparatus, transmitting apparatus and receiving apparatus which can prevent characteristics of a high frequency semiconductor element from being deteriorated so that the high frequency semiconductor element can be made to operate stably.

The invention provides a high frequency semiconductor apparatus comprising a high frequency semiconductor element, a dielectric substrate on which the high frequency semiconductor element is mounted, and a circuit substrate on which the dielectric substrate is mounted, wherein a heat transmission path is formed from the high frequency semiconductor element via the dielectric substrate to the circuit substrate.

According to the invention, the high frequency semiconductor apparatus comprises at least a high frequency semiconductor element, the dielectric substrate and the circuit substrate, and the dielectric substrate is mounted on the circuit substrate. The high frequency semiconductor element is mounted on the dielectric substrate. The heat transmission path is formed from the high frequency semiconductor element to the circuit substrate via the dielectric substrate. Therefore, heat generated by the high frequency semiconductor element is conducted through the heat transmission path. In other words, the heat is sequentially conducted from the high frequency semiconductor element to the dielectric substrate, and then the circuit substrate.

According to the invention, a heat transmission path is formed from a high frequency semiconductor element to a circuit substrate via a dielectric substrate. Therefore, heat generated by the high frequency semiconductor element is conducted through the heat transmission path. That is, the heat is sequentially conducted from the high frequency semiconductor element to the dielectric substrate, and then the circuit substrate. Therefore, it is possible to prevent the generated heat from stagnating around the high frequency semiconductor element. In other words, the heat generated by the high frequency semiconductor element is released to outside of the dielectric substrate. Thus, it is possible to prevent characteristics of the high frequency semiconductor element from being deteriorated so that the high frequency semiconductor element can be made to operate stably.

Further, in the invention, it is preferable that the heat transmission path includes ground layers disposed on the dielectric substrate and the circuit substrate, respectively.

According to the invention, the heat generated by the high frequency semiconductor element is conducted through the ground layers respectively disposed on the dielectric substrate and the circuit substrate. This makes it possible to prevent the heat from stagnating around the high frequency semiconductor element.

Further, in the invention, it is preferable that the heat transmission path comprises a layer formed of a conducting material, the layer being disposed between the ground layer disposed on the dielectric substrate and the ground layer disposed on the circuit substrate.

According to the invention, the heat generated by the high frequency semiconductor element is conducted through the ground layer disposed on the dielectric substrate, the layer formed of a conducting material, and the ground layer disposed on the circuit substrate. This makes it possible to prevent the heat from stagnating around the high frequency semiconductor element.

Further, in the invention, it is preferable that a via hole extending from one ground layer to the other ground layer is formed.

According to the invention, the via hole extending from one ground layer to the other ground layer allows the stagnated heat around the high frequency semiconductor element to escape.

Further, in the invention, it is preferable that the high frequency semiconductor apparatus further comprises a planar antenna disposed on one surface of the dielectric substrate facing the circuit substrate, and the ground layer disposed on the dielectric substrate is arranged on the one surface thereof so as to surround the planar antenna.

Further, according to the invention, a planar antenna is disposed on one surface of the dielectric substrate facing the circuit substrate. Since the ground layer disposed on the dielectric substrate is arranged on the one surface thereof so as to surround the planar antenna, the following effects are obtained. A bonding face is formed over a large area around the planar antenna without affecting size and characteristics of the planar antenna. Therefore, the heat is conducted with high efficiency, and a high mechanical strength can be obtained at a connection of the dielectric substrate and the circuit substrate.

Further, in the invention, it is preferable that the ground layer disposed on the circuit substrate serves as a common ground layer for the semiconductor element and a conductor of a planar antenna.

According to the invention, the ground layer disposed on the circuit substrate serves as a common ground conductor layer for the semiconductor element and a conductor of a planar antenna. Since the ground layer for the high frequency semiconductor element and the planar antenna are the same layer, characteristics of the high frequency is excellent and also stable maintenance of operation can be realized.

Further, in the invention, it is preferable that the high frequency semiconductor apparatus further comprises an external housing to which the ground layer disposed on the circuit substrate is connected.

According to the invention, since the ground layer is connected to an external housing, the heat generated by the high frequency semiconductor element is conducted to the ground layer disposed on the dielectric substrate, and then the ground layer disposed on the circuit substrate and thereafter, the external housing sequentially. Therefore, a higher heat radiating effect can be attained by the external housing.

Further, the invention provides a transmitting apparatus provided with the high frequency semiconductor apparatus mentioned above.

According to the invention, since the transmitting apparatus is provided with the high frequency semiconductor apparatus having a high radiating effect, heat radiating components such as a heat sink, a heat pipe and a heat radiating sheet as measures for heat radiation can be omitted. Therefore, devices can be smaller in size without decreasing freedom of system design. This makes it possible to improve versatility of the transmitting apparatus.

The invention provides a receiving apparatus provided with the high frequency semiconductor apparatus mentioned above.

According to the invention, since the receiving apparatus is provided with the high frequency semiconductor apparatus having a high radiating effect, heat radiating components such as a heat sink, a heat pipe and a heat radiating sheet as measures for heat radiation can be omitted. Therefore, devices can be smaller in size without decreasing freedom of system design. This makes it possible to improve versatility of the receiving apparatus.

BRIEF DESCRIPTION OF THE DRAWINGS

Other and further objects, features, and advantages of the invention will be more explicit from the following detailed description taken with reference to the drawings wherein:

FIG. 2A is a plan view showing one surface of a dielectric substrate facing a circuit substrate and FIG. 2B is a plan view showing a periphery of a mounting portion of one surface of the circuit substrate facing the dielectric substrate;

DETAILED DESCRIPTION OF THE PREFERRED EMBODIMENTS

Figure 1:
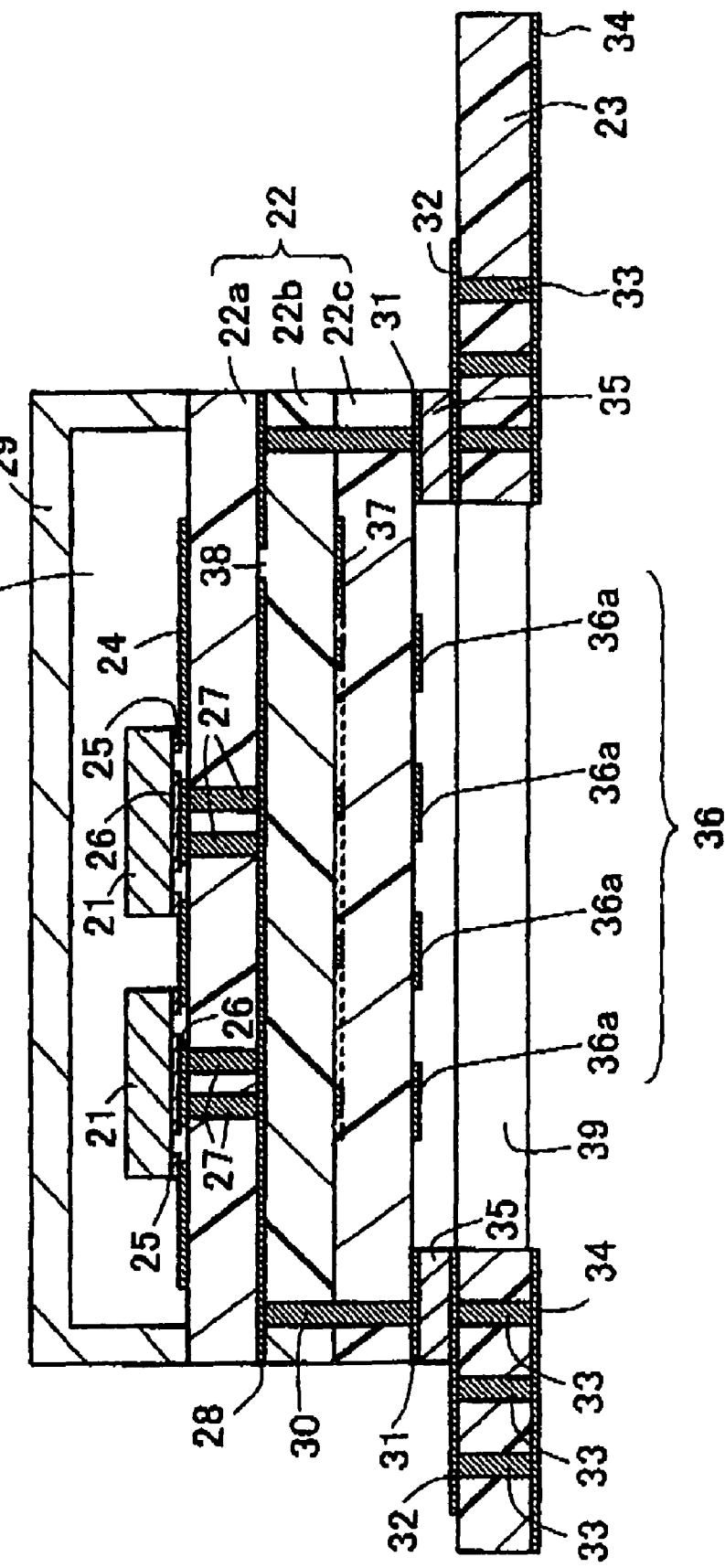
FIG. 1 is a cross sectional view of a high frequency semiconductor apparatus according to a first embodiment of the invention, taken along a virtual plane extending in a thickness direction of a substrate.

Now referring to the drawings, preferred embodiments of the invention are described below.

FIG. 1 is a cross sectional view of a high frequency semiconductor apparatus 20 according to a first embodiment of the invention, taken along a virtual plane extending in a thickness direction of a substrate. The high frequency semiconductor apparatus 20 according to the first embodiment (hereinafter referred to as a first semiconductor apparatus 20) is applied to, for instance, an antenna-integrated wireless communication apparatus for microwave communication. The first semiconductor apparatus 20 comprises a high frequency semiconductor element 21, a dielectric substrate 22 on which a high frequency semiconductor element 21 is mounted, and circuit substrate 23. The dielectric substrate 22 includes first, second, and third dielectric layers 22a, 22b, and 22c. On one surface of the dielectric substrate 22, the high frequency semiconductor element 21 is mounted by use of a flip-chip bonding.

On the one surface of the dielectric substrate 22, a signal transmitting microstrip line 24 is provided. A signal terminal 25 attached to the high frequency semiconductor element 21 is connected to the signal transmitting microstrip line 24. A ground terminal 26 attached to the high frequency semiconductor element 21 is connected to a first ground layer 28 through a grounding via hole 27. The first ground layer 28 is formed between the first and second dielectric layers 22a and 22b. In other words, the first ground layer 28 is disposed inside the dielectric substrate 22. The one surface of the dielectric substrate 22 is covered and sealed by a lid 29.

A first via hole 30 is formed so as to penetrate the second and third dielectric layers 22b and 22c. The first ground layer 28 is connected to a first ground sublayer 31 through the first via hole 30. The first ground sublayer 31 is formed on a bottom surface portion of the dielectric substrate 22.

The circuit substrate 23 is provided outside the dielectric substrate 22. In other words, a second ground layer 32 is formed on one surface of the circuit substrate 23 facing the dielectric substrate 22. The second ground layer 32 is connected through a second via hole 33 to a third ground layer 34 formed on a bottom surface portion of the circuit substrate 23. In other words, in the circuit substrate 23, the second via hole 33 for connecting the second and third ground layers 32 and 34 is formed so as to penetrate the circuit substrate 23 in a thickness direction thereof. The bottom surface portion of the dielectric surface 22 is made to face the one surface of the circuit substrate 23. The first ground sublayer 31 and the second ground layer 32 are connected by a bonding material layer 35 formed of a conductive bonding material such as "solder" so that the circuit substrate 23 is electrically and physically connected to the dielectric substrate 22. The grounding via hole 27, the first ground layer 28, the first via hole 30, the first ground sublayer 31, the bonding material layer 35 formed of the conductive bonding material, the second ground layer 32, the second via hole 33, and the third ground layer 34 are equivalent to a heat transmission path.

FIG. 2A is a plan view showing one surface of the dielectric substrate 22 facing the circuit substrate 23 and FIG. 2B is a plan view showing a periphery of a mounting portion of one surface of the circuit substrate 23 facing the dielectric substrate 22. Description will be given by further referring to FIG. 1. The planar antenna 36 is provided on the one surface of the dielectric substrate 22 facing the circuit substrate 23, that is, a bottom surface portion of the dielectric surface 22. The planar antenna 36 is formed by setting a plurality of conductive patches 36a (only 4 patches are shown in FIG. 1) in array. An antenna feeding microstrip line 37 is formed between the second and third dielectric layers 22b and 22c. A slot 38 for feeding is formed in the first ground layer 28. The first ground layer 28 is a ground layer for an antenna feeding microstrip line 37 and also for a conductive patch 36a of the planar antenna 36. Further, the first ground layer 28 is also a ground conductor for the high frequency semiconductor element 21. Thus, the first ground layer 28 serves as a common ground conductor layer. Therefore, characteristics of the high frequency is excellent and also stable maintenance of operation can be realized since the ground conductor for the high frequency semiconductor element 21 and the planar antenna 36 are the same layer.

A through hole 39 having a substantially rectangular shape is formed in the circuit substrate 23. The through hole 39 allows the planar antenna 36 provided on the bottom surface portion of the dielectric substrate 22 to be open. The substantially rectangular shape includes a rectangular shape. In other words, the through hole 39 is formed in a portion of the circuit substrate 23 facing a rectangular region which is slightly larger than a region covering the entire planar antenna 36. The planar antenna 36 is configured so as to transmit and receive electromagnetic waves via the through hole 39.

The first ground sublayer 31 is disposed on the bottom surface portion of the dielectric substrate 22 so as to surround the planar antenna 36 containing the plurality of conductive patches 36a. In other words, the first ground sublayer 31 is formed in a rectangular frame region so as to surround a region 36A covering the entire planar antenna 36. A plurality of first terminals 40 are formed by spacing out regular distances therebetween on one side portion of the bottom surface of the dielectric substrate 22. These first terminals 40 are used for applying bias to signals and the high frequency semiconductor element 21. A plurality of second terminals 41 are formed at regular intervals on the one surface of the circuit substrate 23 facing the dielectric substrate 22. These second terminals 41 are formed on a portion away from one side portion of the second ground layer 32 at a short distance. The first and second terminals 40 and 41 are connected each other by the bonding material layer 35 formed of the conductive bonding material.

According to the first semiconductor apparatus 20 described above, heat generated by the high frequency semiconductor elements 21 is sequentially conducted through the grounding via hole 27 to the first ground layer 28, the first via hole 30, the first ground sublayer 31, the bonding material layer 35, the second ground layer 32, the second via hole 33, and the third ground layer 34. Therefore, the heat generated by the high frequency semiconductor element 21 does not stagnate in a space 42 covered by the lid 29. Consequently, the high frequency semiconductor element 21 can prevent deterioration of characteristics, attributable to heat stagnation (confinement) around the high frequency semiconductor element 21. Therefore, the high frequency semiconductor element 21 can be made to operate stably. Moreover, since the heat can be prevented from stagnating in the space 42 covered by the lid 29, the space 42 to be covered by the lid 29 can be smaller than that of the related art. Therefore, the lid 29 can be downsized, which results in a reduced size of the first semiconductor apparatus 20.

Further, according to the first semiconductor apparatus 20, since the first ground sublayer 31 to be provided on the bottom surface portion of the dielectric substrate 22 is disposed in a rectangular frame region so as to surround the region 36A covering the entire planar antenna 36, the following effects are gained. A bonding face of the bonding material layer 35 and the circuit substrate 23 is formed over a large area of the rectangular frame region around the planar antenna 36 without affecting size and characteristics of the planar antenna 36. Therefore, the heat is conducted with high efficiency, and a high mechanical strength can be obtained at a connection of the dielectric substrate 22 and the circuit substrate 23. Grounds of the dielectric substrate 22 and the circuit substrate 23 are connected to each other over a large area, so that the first ground layer 28 of the dielectric substrate 22 is made to be a favorable ground even in terms of high frequency, and the first ground layer 28 is connected to the second and third ground layers at a low ground inductance. Therefore, the high frequency semiconductor element 21 can be made to operate stably.

Figure 3:
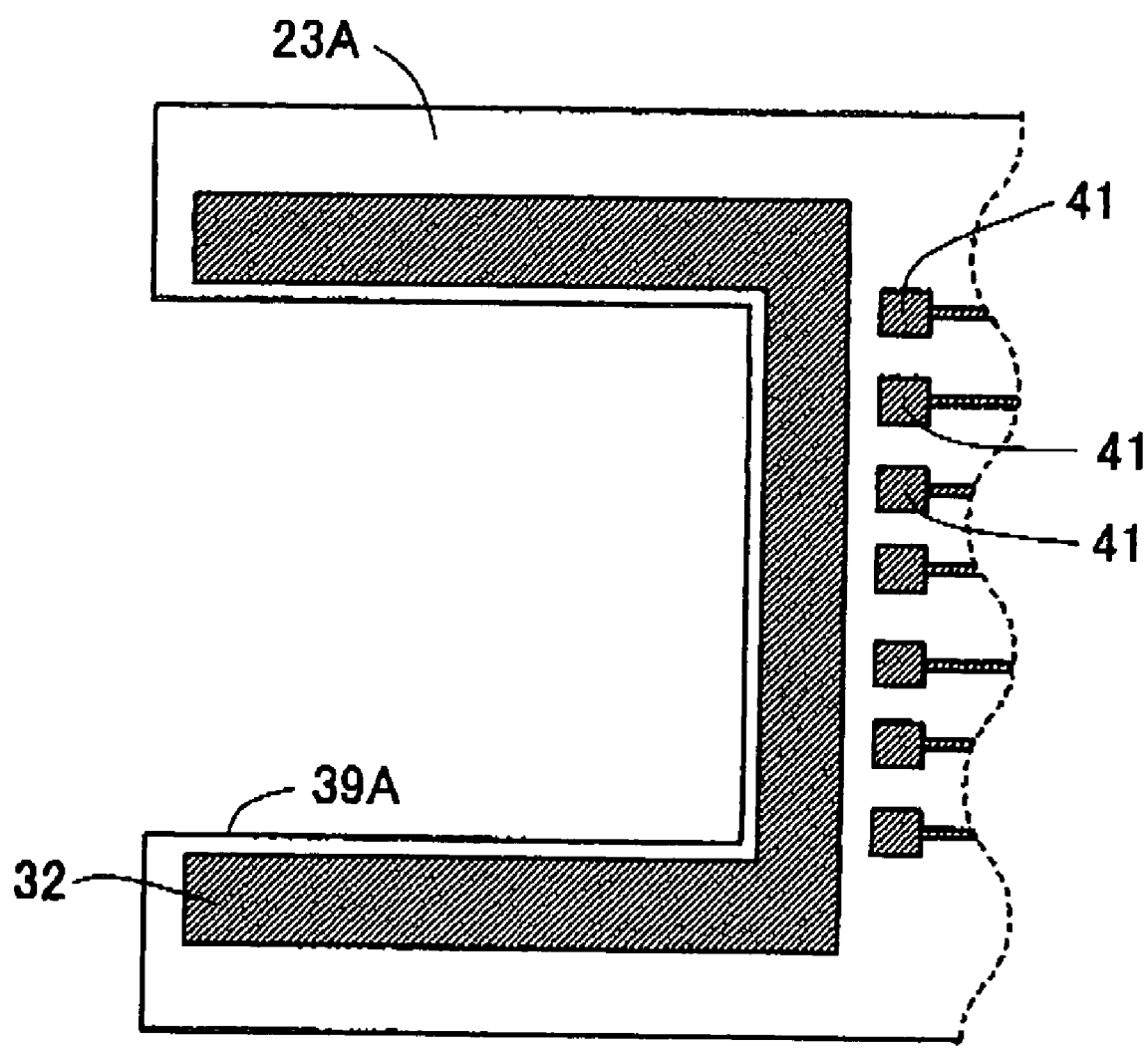
FIG. 3 is a plan view showing a periphery of a mounting portion of a circuit substrate according to a modified embodiment obtained by partially modifying the first embodiment.

FIG. 3 is a plan view showing a periphery of a mounting portion of a circuit substrate 23A according to a modified embodiment obtained by partially modifying the first embodiment. According to the high frequency semiconductor apparatus 20 of the first embodiment, the through hole 39 having a substantially rectangular shape for allowing the planar antenna 36 to be open is formed on the circuit substrate 23, but a shape of the through hole 39 is not always restricted to the substantially rectangular shape. In the circuit substrate 23A according to the modified embodiment, for instance, one of the other side portions of the circuit substrate 23A itself, except for one side portion on which the second terminals 41 are provided, is removed so that the original through hole having a substantially rectangular shape is formed to be a U-shaped through hole 39A. It is thus possible to remove (cut out) one portion of the circuit substrate 23. In this case, an entering or radiating efficiency of electromagnetic wave can be slightly higher. In the first embodiment, the planar antenna 36 is realized by the conductive patches 36a, namely a patch antenna, but the antenna does not always restricted to the patch antenna. For instance, a slot antenna can also be applied. In some cases, a plurality of the conductive patches 36a can be replaced by a single conductive patch 36a. It is possible to constitute a single conductive patch 36a or the plurality of conductive patches 36a as a primary radiation source and lens antenna as a secondary radiation source.

According to a transmitting apparatus provided with the first semiconductor apparatus 20, a high frequency signal outputted from the high frequency semiconductor element 21 is transmitted through the signal transmitting microstrip line 24 through the slot 38 to the antenna feeding microstrip line 37, and then transmitted to an end portion of the antenna feeding microstrip line 37. The end portion of the antenna feeding microstrip line 37 is electromagnetically connected through the third dielectric layer 22c to the conductive patches 36a, and therefore the high frequency signal transmitted to the end portion is transmitted to the conductive patches 36a, respectively. The high frequency signal resonates on the one surface of the each conductive patch 36a, with the result that a large electric current flows and the electromagnetic wave is radiated to space. According to the transmitting apparatus, since the transmitting apparatus is provided with the first semiconductor apparatus 20 with a high radiating effect, components for heat radiation, such as a heat sink, a heat pipe and a heat radiating sheet as measures for heat radiation can be omitted. Therefore, devices can be smaller in size without decreasing freedom of the system design. This makes it possible to improve versatility of the transmitting apparatus. The functions of the transmitting apparatus in which the heat is radiated from the conductive patches 36a are described as above. Since the antenna portion has same directivity and efficiency by reversible action even in a case where an input wave from the space is received, the receiving apparatus can also be configured by modifying the configuration of the high frequency semiconductor element 21.

Figure 4:
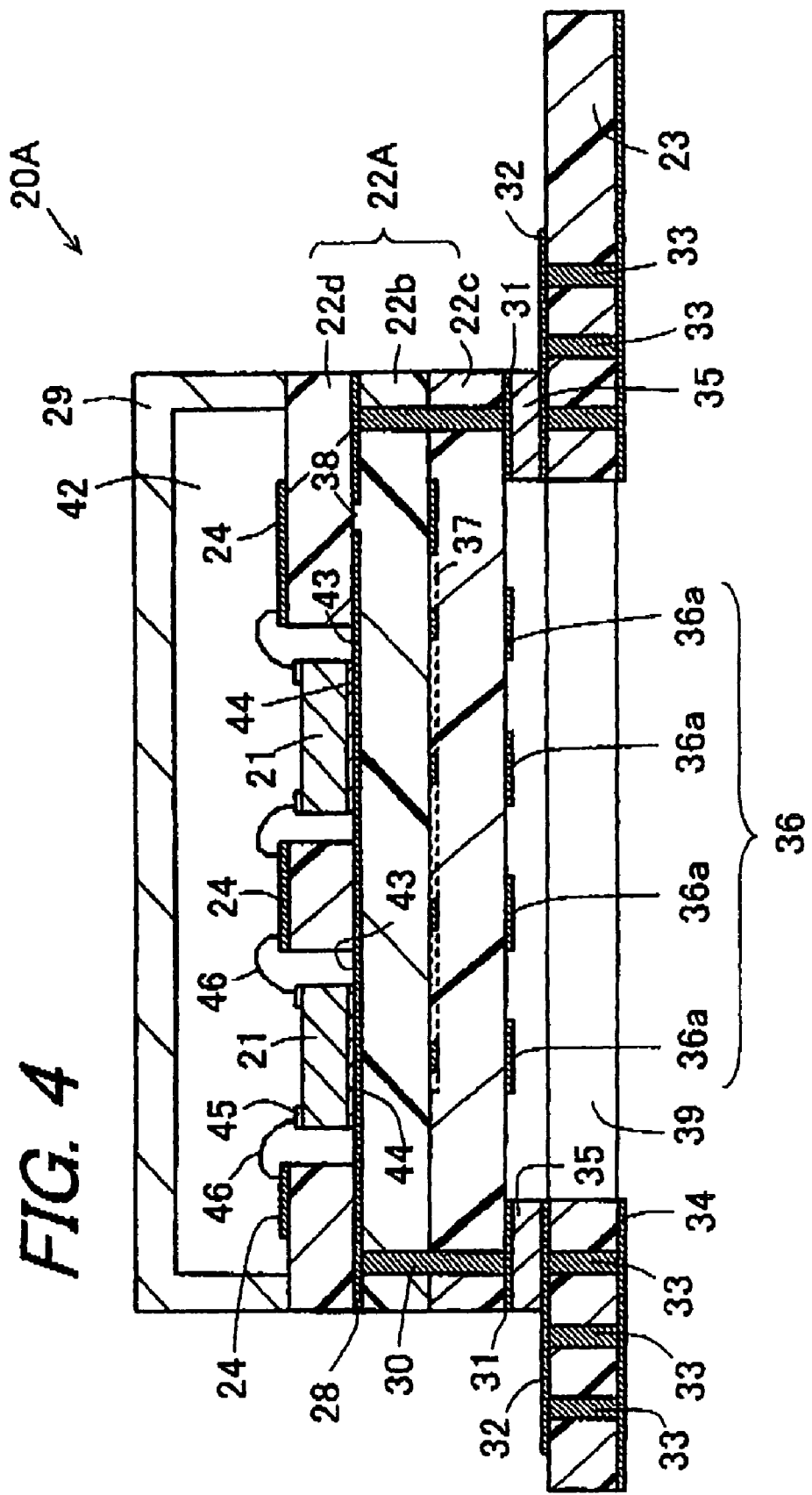
FIG. 4 is a cross sectional view of a high frequency semiconductor apparatus according to a second embodiment of the invention, taken along a virtual plane extending in a thickness direction of a substrate.

FIG. 4 is a cross sectional view of a high frequency semiconductor apparatus 20A according to a second embodiment of the invention, taken along a virtual plane extending in a thickness direction of a substrate. Note that the same components as those according to the first embodiment will be denoted by the same reference numerals and descriptions thereof will be omitted. The high frequency semiconductor apparatus 20A according to the second embodiment (hereinafter referred to as a second semiconductor apparatus 20A) comprises a dielectric substrate 22A and the circuit substrate 23. A cavity 43 is formed in a first dielectric layer 22d of the dielectric substrate 22A. The high frequency semiconductor element 21 is mounted on a second dielectric layer 22b by use of the cavity 43 of the first dielectric layer 22d. The high frequency semiconductor element 21 is bonded directly to the first ground layer 28 by die-bonding a ground terminal 44 thereof to the first ground layer 28. A signal terminal 45 of the high frequency semiconductor element 21 is connected to the signal transmitting microstrip line 24 by a wire 46. In the second embodiment, the first ground layer 28, the first via hole 30, the first ground sublayer 31, the boding material layer 35, the second ground layer 32, the second via hole 33, and the third ground layer 34 are equivalent to a heat transmission path.

According to the second semiconductor apparatus 20A described above, the heat generated by the high frequency semiconductor element 21 is sequentially conducted from the bottom surface of the high frequency semiconductor element 21 facing the first ground layer 28, that is, a ground surface, through the first ground layer 28 to the first via hole 30, the first ground sublayer 31, the bonding material layer 35, the second ground layer 32, the second via hole 33, and the third ground layer 34. Therefore, the heat generated by the high frequency semiconductor element 21 does not stagnate in the space 42 covered by the lid 29. Consequently, the high frequency semiconductor element 21 can prevent deterioration of characteristics, attributable to heat stagnation (confinement) around the high frequency semiconductor element. Therefore, the high frequency semiconductor element 21 can be made to operate stably. Moreover, since the high frequency semiconductor element 21 is mounted on the second dielectric layer 22b by use of the cavity 43 of the first dielectric layer 22d, the second semiconductor apparatus 20A can be more downsized in a thickness direction of the substrate compared to the first semiconductor apparatus 20. In addition, since the high frequency semiconductor element 21 are bonded so as that the bottom surface thereof and the first ground layer 28 directly face each other, a heat radiating effect is further improved in comparison with the first embodiment of the invention. In addition, as described above, not only a heat radiating effect but also electric characteristics are excellent. In other words, in this embodiment of the invention, the first ground layer 28 serves as a ground conductor layer for the antenna feeding microstrip line 37 and the conductive patches 36a of the planar antenna 36, and the first ground layer 28 also serves as a ground conductor layer of the high frequency semiconductor element 21, and therefore high frequency characteristics are excellent and stable operation characteristic can be realized. In this embodiment of the invention, the bottom surface 44 of the high frequency semiconductor element 21 are bonded so as to directly face each other, stable operation characteristics are more excellent compared with the first embodiment of this invention. As to the other effects, the second semiconductor apparatus 20A gains the same effects as those gained by the first semiconductor apparatus 20.

Figure 5:
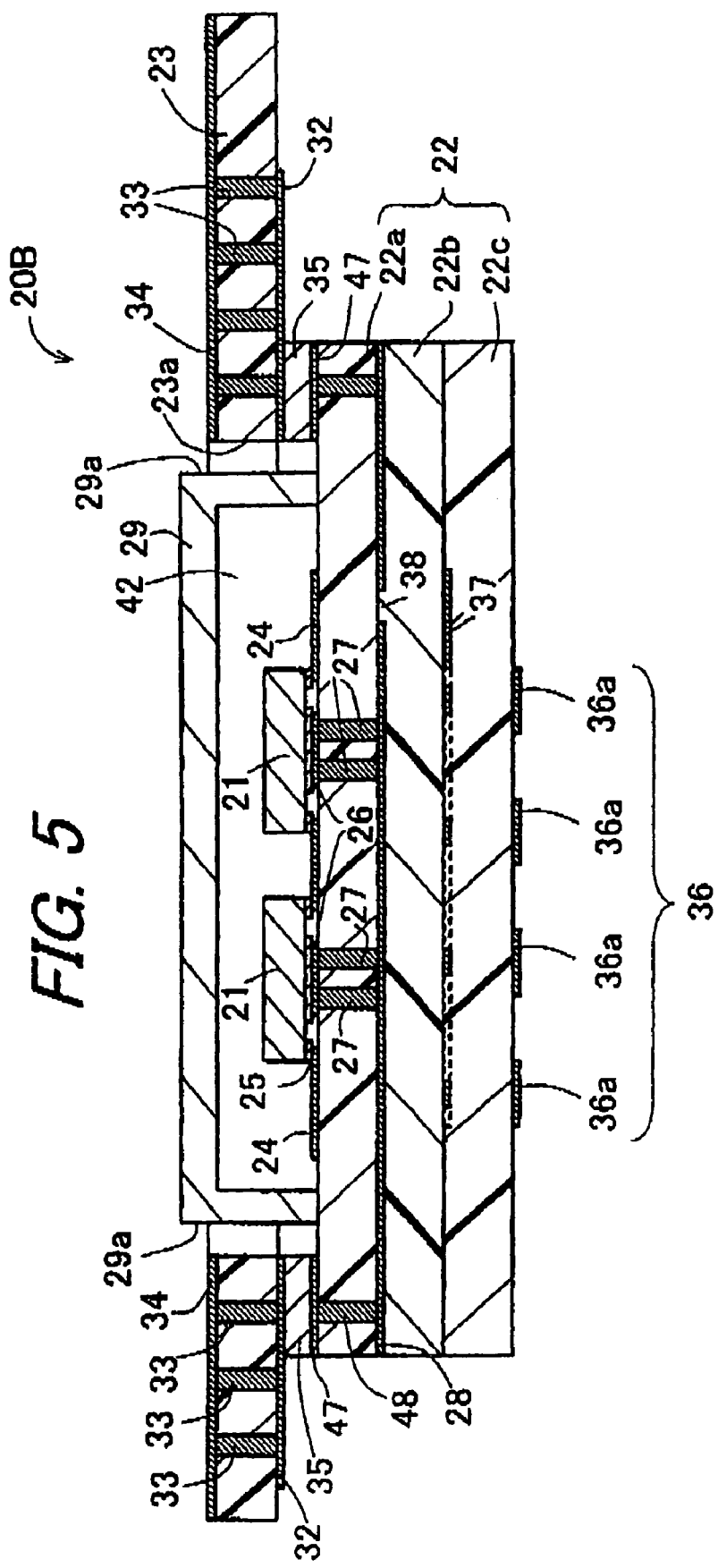
FIG. 5 is a cross sectional view of a high frequency semiconductor apparatus according to a third embodiment of the invention, taken along a virtual plane extending in a thickness direction of a substrate.

FIG. 5 is a cross sectional view of a high frequency semiconductor apparatus 20B according to a third embodiment of the invention, taken along a virtual plane extending in a thickness direction of a substrate. Note that the same components as those according to the first or second embodiment will be denoted by the same reference numerals and descriptions thereof will be omitted. The high frequency semiconductor apparatus 20B according to the third embodiment (hereinafter referred to as a third semiconductor apparatus 20B) comprises the dielectric substrate 22 and the circuit substrate 23. On the one surface of the dielectric substrate 22, the high frequency semiconductor element 21 is mounted by use of a flip-chip bonding. A portion of the one surface of the dielectric substrate 22 covering at least the high frequency semiconductor element 21 and the signal transmitting microstrip line 24 is covered and sealed by the lid 29. The one portion is provided near the center of the one surface, excluding outer side portions of the rectangular frame, of the dielectric substrate 22.

The planar antenna 36 is provided on the bottom surface of the third dielectric layer 22c of the dielectric substrate 22 facing outside. The planar antenna 36 is formed by setting a plurality of the conductive patches 36a in array. On the outer side portions of the one surface of the dielectric substrate 22, a second ground sublayer 47 is formed so as to make a substantially rectangular frame when the second ground sublayer 47 is viewed in a thickness direction of a substrate. The substantially rectangular frame includes a rectangular frame. The first ground layer 28 is connected through a third via hole 48 to the second ground sublayer 47 formed on the one surface of the dielectric substrate 22. The third via hole 48 is formed so as to penetrate the first dielectric layer 22a. The third via hole 48, which is formed on the outer side portion of the first dielectric layer 22a, has different functions with respect to frequency from those of the grounding via hole 27 of the high frequency semiconductor element 21.

The one surface of the dielectric substrate 22, on which the high frequency semiconductor element 21 is to be mounted, is disposed so as to face the one surface of the circuit substrate 23 and the second ground sublayer 47 and the second ground layer 32 are connected to each other by the bonding material layer 35. In the circuit substrate 23, formed is a penetrating recess 23a for preventing an interference with the lid 29. The recess 23a is formed away from an outer wall portion 29a of the lid 29 at a distance. In other words, in the circulate substrate 23, formed is the recess 23a which is larger than the outer wall portion 29a of the lid 29. The bonding material layer 35 is formed of a conductive bonding material such as "solder". The dielectric substrate 22 is thus electrically and physically connected to the circuit substrate 23.

According to the third semiconductor apparatus 20B described above, the heat generated by the high frequency semiconductor element 21 is sequentially conducted through the grounding via hole 27 to the first ground layer 28, the third via hole 48, the second ground sublayer 47, the bonding material layer 35, the second ground layer 32, the second via hole 33, and the third ground layer 34. Therefore, the heat generated by the high frequency semiconductor element 21 does not stagnate in a space covered by the lid 29. Consequently, the high frequency semiconductor element 21 can prevent deterioration of characteristics, attributable to heat stagnation (confinement) around the high frequency semiconductor element. Therefore, the high frequency semiconductor element 21 can be made to operate stably.

Moreover, according to the third semiconductor apparatus 20B, the recess 23a, which prevents the interference with the lid 29, is formed in the circuit substrate 23. In addition, the outer side portion of the one surface of the dielectric substrate 22 is face-to-face connected to the one surface of the circuit substrate 23. Accordingly, the third semiconductor apparatus 20B can be smaller in a thickness direction of the substrate compared to the first semiconductor apparatus 20. Therefore, the third semiconductor apparatus 20B can be downsized. Since the recess 23a formed in the circuit substrate 23 and the bonding material layer 35 are formed away from the outer wall portion 29a of the lid 29 at a distance, it is possible to reliably prevent the heat from being transmitted from the bonding material layer 35, the second ground layer 32, the second via hole 33, and the third ground layer 34 to the lid 29 and the high frequency semiconductor element 21. Moreover, according to the third semiconductor apparatus 20B, since it is unnecessary to form a via hole on the second and third dielectric layers 22b and 22c, it is possible to reduce production cost compared to that of the first semiconductive apparatus 20.

Figure 6:
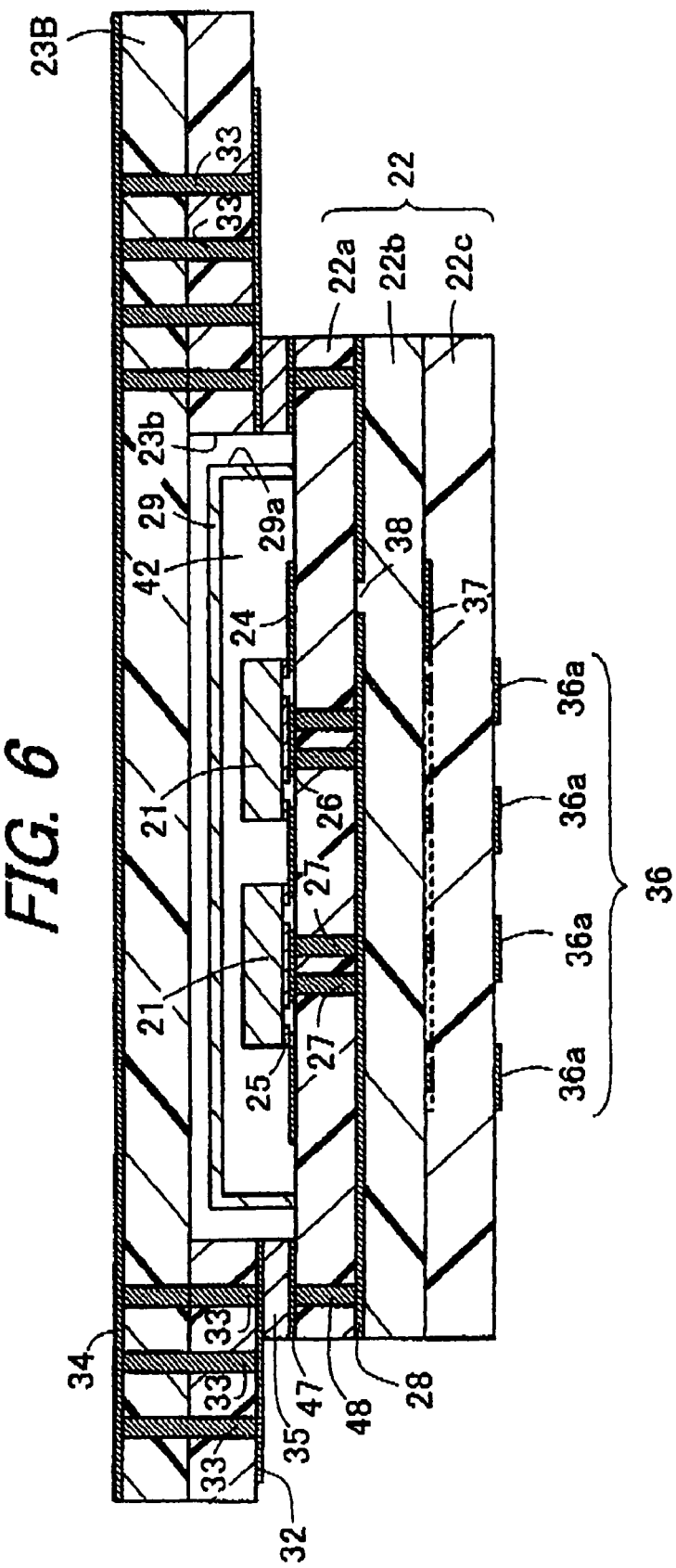
FIG. 6 is a cross sectional view of a high frequency semiconductor apparatus according to a modified embodiment obtained by partially modifying the third embodiment, taken along a virtual plane extending in a thickness direction of a substrate.

FIG. 6 is a cross sectional view of a high frequency semiconductor apparatus according to a modified embodiment obtained by partially modifying the third embodiment, taken along a virtual plane extending in a thickness direction of a substrate. In the third embodiment, the penetrating recess 23a is formed in the circuit substrate 23, but it is not always restricted to this mode. For instance, as shown in FIG. 6, non-penetrating recess 23b can be formed in the circuit substrate 23B. In this case, the lid 29 covering the one surface of the dielectric substrate 22 can be omitted. This makes it possible to reduce a number of components so that the production cost of the high frequency semiconductor apparatus can be reduced. Moreover, the recess of the circuit substrate 23B itself can also be omitted.

Figure 7:
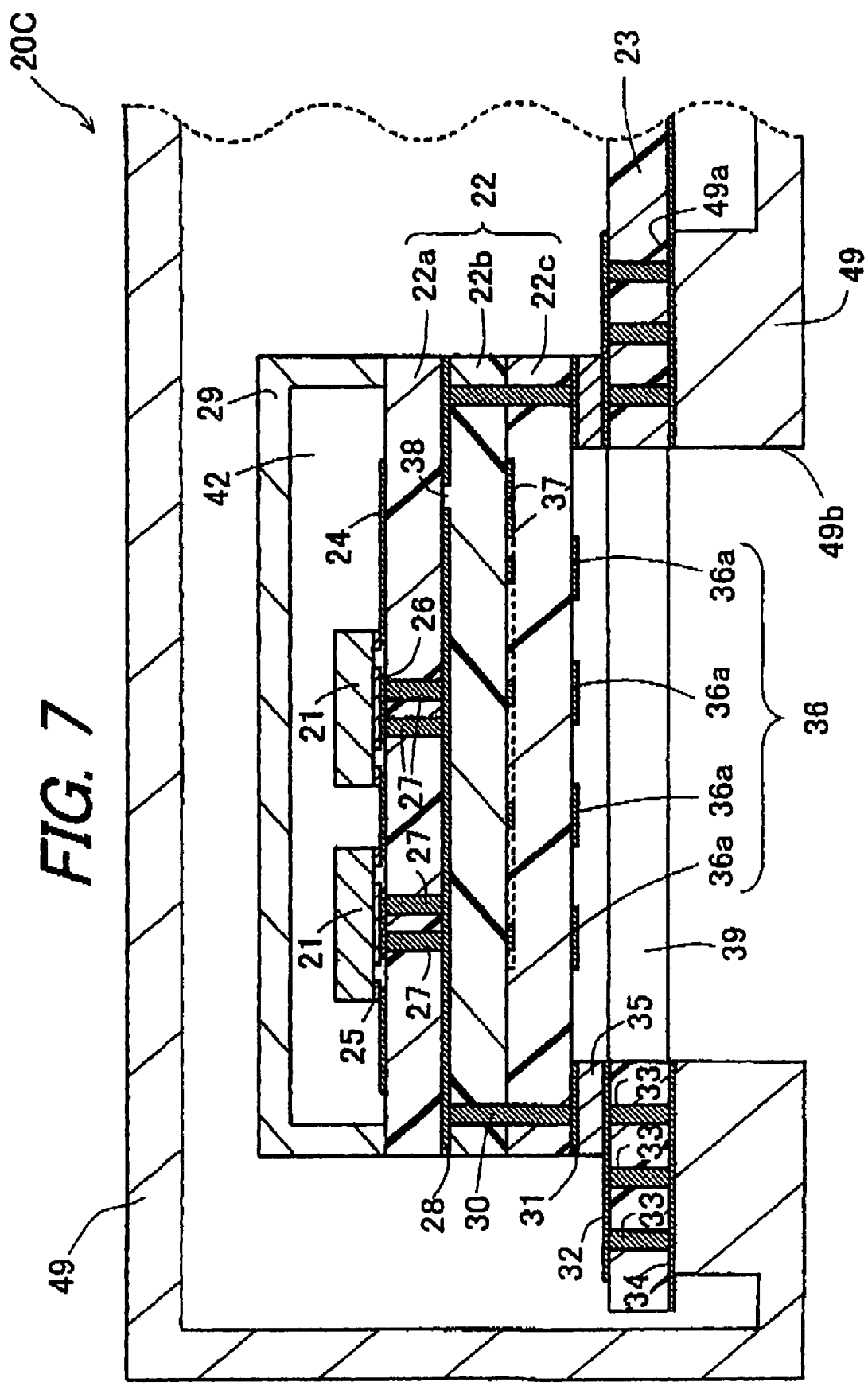
FIG. 7 is a cross sectional view of a high frequency semiconductor apparatus according to a fourth embodiment of the invention, taken along a virtual plane extending in a thickness direction of a substrate.

FIG. 7 is a cross sectional view of a high frequency semiconductor apparatus 20C according to a fourth embodiment of the invention, taken along a virtual plane extending in a thickness direction of a substrate. Note that the same components as those according to either of the first, second, or third embodiment will be denoted by the same reference numerals and descriptions thereof will be omitted. The high frequency semiconductor apparatus 20C according to the fourth embodiment (hereinafter referred to as a fourth semiconductor apparatus 20C) comprises the dielectric substrate 22 on which the high frequency semiconductor element 21 is mounted, the circuit substrate 23, and an external housing 49. The external housing 49 is formed of a metal material such as aluminum alloy or magnesium alloy, which has a high thermal conductivity. The fourth semiconductor apparatus 20C is so configured that the dielectric substrate 22 and the circuit substrate 23 are housed in the external housing 49. In other words, the third ground layer 34 of the circuit substrate 23 is bonded to an inner wall portion 49a of the external housing 49. Note that in the external housing 49 is formed a hole portion 49b which is slightly smaller in size than an area of the one surface of the dielectric substrate 22. The planar antenna 36 is configured so as to transmit and receive electromagnetic waves via the through hole 39 and the hole portion 49b. The fourth semiconductor apparatus 20C is so configured that the dielectric substrate 22 and the circuit substrate 23 can be housed in the external housing 49 by use of the hole portion 49b.

According to the fourth semiconductor apparatus 20C described above, the heat generated by the high frequency semiconductor element 21 is sequentially conducted through the grounding via hole 27 to the first ground layer 28, the first via hole 30, the first ground sublayer 31, the bonding material layer 35, the second ground layer 32, the second via hole 33, and the third ground layer 34. Furthermore, the heat is transmitted from the third ground layer 34 to the external housing 49. Since the external housing 49 is so configured that at least the dielectric substrate 22 and the circuit substrate 23 can be housed therein, a surface area exposed to the air is large and a radiating effect is high. Therefore, the heat generated by the high frequency semiconductor element 21 does not stagnate in a space covered by the lid 29. Consequently, the high frequency semiconductor element 21 can prevent deterioration of characteristics, attributable to the heat. Therefore, the high frequency semiconductor element 21 can be made to operate stably. As materials of the external housing 49, the above-mentioned metal materials are preferable, but at least either of other metal materials, resin materials such as ABS and acrylic resin, or other resin materials can be also available.

Figure 8:
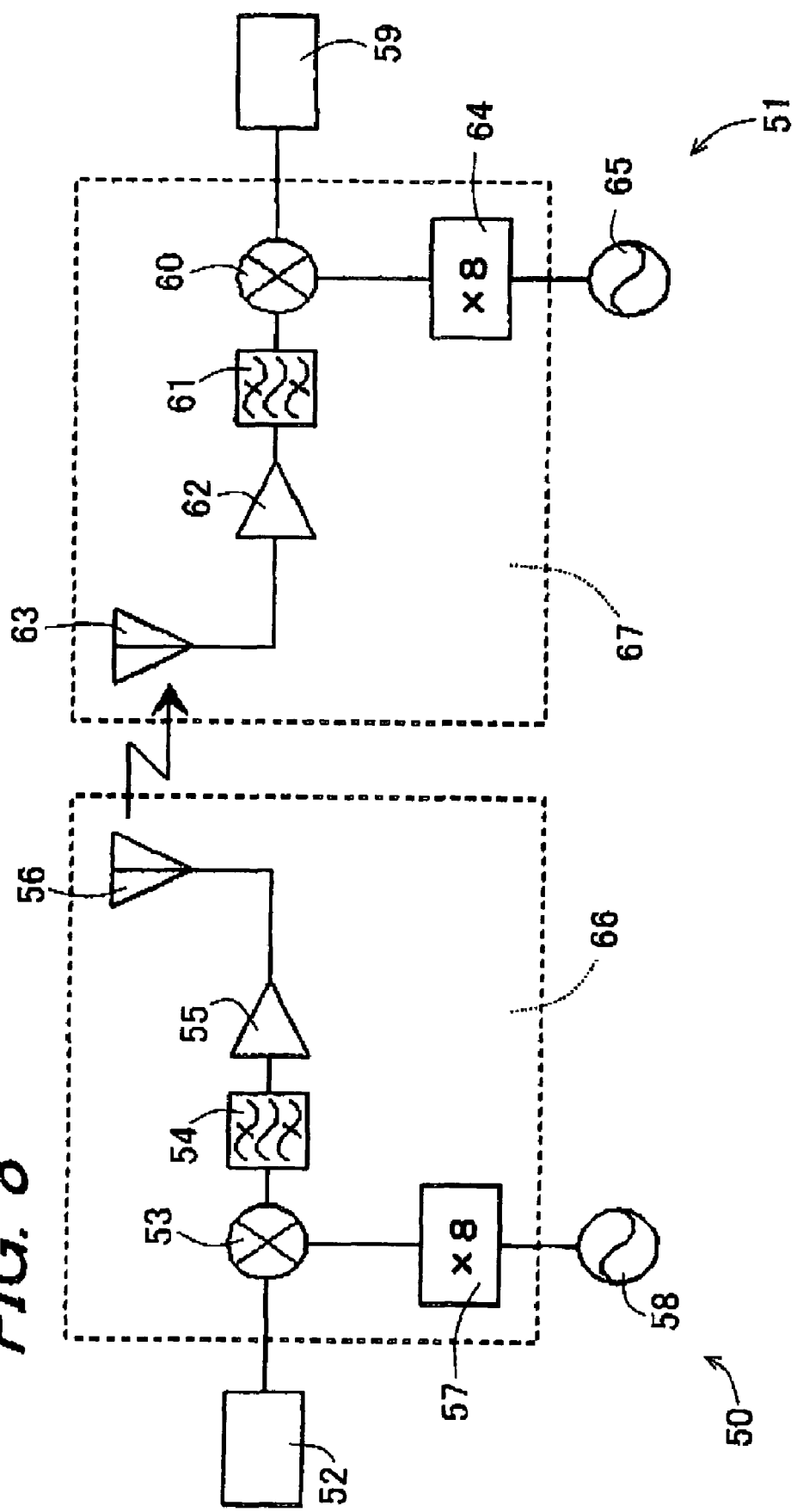
FIG. 8 is a schematical view showing a constitution of a transmitting apparatus and receiving apparatus according to embodiments of the invention.
Figure 9:
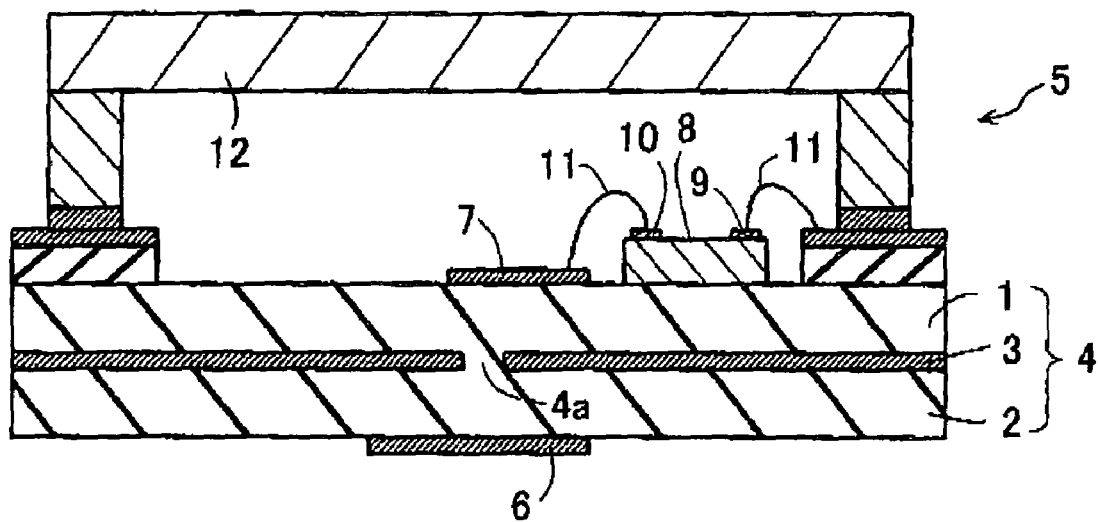
FIG. 9 is a cross sectional view of a conventional high frequency semiconductor apparatus.

FIG. 8 is a schematical view showing a constitution of a transmitting apparatus 50 and receiving apparatus 51 according to embodiments of the invention. The transmitting apparatus 50 comprises a modulating signal source 52, an even harmonic mixer 53, a bandpass filter 54, a power amplifier 55, a planar antenna 56, a multiplier 57 and a reference signal source 58. The modulating signal source 52 outputs images and data, and has functions to output, for instance, an intermediate frequency signal of a broadcast satellite or communication satellite. The receiving apparatus 51 comprises a tuner 59, an even harmonic mixer 60, a bandpass filter 61, a low noise amplifier 62, a planar antenna 63, a multiplier 64, and a reference signal source 65.

Of the transmitting apparatus 50, the multiplier 57, the even harmonic mixer 53, the bandpass filter 54, the power amplifier 55, and the planar antenna 56 are housed in a first millimeter-wave package 66. Together with these devices, of the receiving apparatus 51, the multiplier 64, the even harmonic mixer 60, the bandpass filter 61, the low noise amplifier 62, and the planar antenna 63 are housed in a second millimeter-wave package 67. The first and second millimeter-wave packages 66 and 67 are equivalent to the high frequency semiconductor apparatus.

In the transmitting apparatus 50, the intermediate frequency signal produced by the modulating signal source 52 falls in a range of 0.5 GHz or more and 2 GHz or less. The intermediate frequency signal is inputted in an intermediate frequency signal terminal of the even harmonic mixer 53. A sinusoidal signal produced in the reference signal source 58, having a frequency of 3.75 GHz, is made to be a sinusoidal local oscillation signal having a frequency of 30 GHz obtained by multiplying the frequency of 3.75 GHz by eight by means of the eightfold multiplier 57. The local oscillation signal is inputted in a local oscillation signal terminal of the even harmonic mixer 53. Then, the intermediate frequency signal and the local oscillation signal are admixed in the even harmonic mixer 53. Of the signals generated by the even harmonic mixer 53, only high frequency signals having frequencies of 60.5 GHz or more and 62 GHz or less pass the bandpass filter 54. Thereafter, the passed high frequency signals are inputted in the power amplifier 55 to be amplified, and then radiated as high frequency electric waves from the planar antenna 56.

The high frequency electric wave radiated from the planar antenna 56 of the transmitting apparatus 50 is received by the planar antenna 63 of the receiving apparatus 51 to be a high frequency signal, and amplified by the low noise amplifier 62. The amplified high frequency signal passes the bandpass filter 61 to be inputted in the high frequency signal terminal of the even harmonic mixer 60. In the receiving apparatus 51, likely to the transmitting apparatus 50, the sinusoidal signal having a frequency of 30 GHz produced by the reference signal source 65 and the eightfold multiplier 64 is inputted in a local oscillation signal terminal of the even harmonic mixer 60. Then, the inputted high frequency signal is admixed with the local oscillation signal inside the even harmonic mixer 60, and converted again to the intermediate frequency signal having a frequency of 0.5 GHz or more and 2 GHz or less. The intermediate frequency signal converted in the even harmonic mixer 60 is inputted in the tuner 59, and converted to desired information by the tuner 59.

The planar antenna 56 of the transmitting apparatus 50 and the planar antenna 63 of the receiving apparatus 51 can also be used together. The eightfold multiplier 57 of the transmitting apparatus 50 and the eightfold multiplier 64 of the receiving apparatus 51 can also be used together. In other words, it is possible to use all components of the transmitting apparatus 50 and receiving apparatus 51 together except for the high frequency semiconductor apparatus according to the antenna-integrated wireless communication apparatus.

Since the above-described transmitting apparatus 50 and the receiving apparatus 51 are provided with the high frequency semiconductor apparatus having the heat transmission path formed from the high frequency semiconductor element to the circuit substrate via the dielectric substrate, the following effects are gained. The transmitting apparatus 50 and the receiving apparatus 51 have high radiating effects, therefore heat radiating components such as a heat sink, a heat pipe and a heat radiating sheet as measures for heat radiation are not required. Consequently, devices can be smaller in size without decreasing freedom of system design.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A high frequency semiconductor apparatus comprising:
   a high frequency semiconductor element,
   a dielectric substrate on which the high frequency semiconductor element is mounted,
   a circuit substrate on which the dielectric substrate is mounted, and
   a planar antenna disposed on one surface of the dielectric substrate facing the circuit substrate, wherein
   a heat transmission path is formed from the high frequency semiconductor element via the dielectric substrate to the circuit substrate.

2. The high frequency semiconductor apparatus of claim 1, wherein the heat transmission path includes ground layers disposed on the dielectric substrate and the circuit substrate, respectively.

3. The high frequency semiconductor apparatus of claim 2, wherein the heat transmission path comprises a layer formed of a conducting material, the layer being disposed between the ground layer disposed on the dielectric substrate and the ground layer disposed on the circuit substrate.

4. The high frequency semiconductor apparatus of claim 2, wherein a via hole extending from one ground layer to the other ground layer is formed.

5. The high frequency semiconductor apparatus of claim 2, wherein
   the ground layer disposed on the dielectric substrate is arranged on the one surface thereof so as to surround the planar antenna.

6. The high frequency semiconductor apparatus of claim 5, wherein the ground layer disposed on the dielectric substrate serves as a common ground layer for the semiconductor element and a conductor of a planar antenna.

7. The high frequency semiconductor apparatus of claim 2, further comprising:
   an external housing to which the ground layer disposed on the circuit substrate is connected.

8. A transmitting apparatus provided with the high frequency semiconductor apparatus of claim 1.

9. A receiving apparatus provided with the high frequency semiconductor apparatus of claim 1.

* * * * *